(12) United States Patent
Shen et al.

(10) Patent No.: US 6,383,846 B1
(45) Date of Patent: May 7, 2002

(54) METHOD AND APPARATUS FOR MOLDING A FLIP CHIP SEMICONDUCTOR DEVICE

(76) Inventors: Chi-Chih Shen; Wei-Chung Wang; Chun-Hung Lin, all of 26, Chin 3rd Rd., 811, Nantze Export Processing Zone, Kaohsiung (TW)

(*) Notice: Subject to any disclaimer, the term of this patent is extended or adjusted under 35 U.S.C. 154(b) by 0 days.

(21) Appl. No.: 09/528,617

(22) Filed: Mar. 20, 2000

(51) Int. Cl.[7] ............................................. H01L 21/44
(52) U.S. Cl. ...................... 438/127; 438/108; 438/125; 438/126
(58) Field of Search ................................ 438/108, 124, 438/125, 126, 127

(56) References Cited

U.S. PATENT DOCUMENTS

| | | | |
|---|---|---|---|
| 5,710,071 A | * | 1/1998 | Beddingfield et al. ...... 438/108 |
| 5,866,442 A | * | 2/1999 | Brand ......................... 438/108 |
| 5,923,959 A | * | 7/1999 | Mess ........................... 438/126 |
| 6,046,076 A | * | 4/2000 | Mitchell et al. ............. 438/127 |

* cited by examiner

Primary Examiner—Kevin M. Picardat
(74) Attorney, Agent, or Firm—Thomas E. Sisson; Jackson Walker

(57) ABSTRACT

A method and apparatus for molding a flip chip semiconductor device are disclosed herein. A substrate having at least one air hole is provided. A chip is mounted on the substrate by multiple solder balls such that the air hole is beneath the chip and surrounded by the multiple solder balls. The substrate mounted with the chip is placed in a mold apparatus which defines at least one air channel aligning with the air hole, such that air can be exhausted via the air hole and the air channel when encapsulation material is filling the mold apparatus.

6 Claims, 9 Drawing Sheets

METHOD AND APPARATUS FOR MOLDING A FLIP CHIP SEMICONDUCTOR DEVICE

BACKGROUND OF THE INVENTION

1. Field of the Invention

The present invention relates to a method and apparatus for molding a flip chip semiconductor device and, more particularly, to a method for effectively molding a flip chip semiconductor device without generating a void and the mold apparatus for utilizing the method.

2. Description of Related Art

Conventionally, as shown in FIG. 9, a chip (70) is mounted on a substrate (71) to form a semiconductor device. The chip (70) is usually provided with a plurality of solder balls (701) formed on a surface thereof and arranged in a matrix form. As such, when in a chip mounting process, a well known flip chip mounting technique is employed to connect the solder balls (701) to corresponding connection points (711) on the substrate (71). Upper and lower surfaces of the substrate (71) are provided with connection points (711, 712), and the upper connection points (711) are electrically connected the corresponding lower connection points (712) via conductor lines inside the substrate (71). The lower connection points (712) are generally bonded with solder balls (not shown) for connecting to other circuit devices.

After such a chip mounting process, the next process to package a semiconductor device is known as an encapsulation process which may be carried out by well known underfill or molding techniques, both of which have the objective of trying to fill a space between the chip (70) and the substrate (71) with an encapsulant, in order to enhance the bonding strength of the solder balls (701). However, because the space between the chip (70) and the substrate (71) is so small and there are lots of solder balls (701) disposed therein, it is always particularly difficult for the encapsulant material to flow through and fill into the space.

Some recent inventions have tried to improve the flip chip encapsulation process.

U.S. Pat. No. 5,385,869 granted to Liu et al. for a "Semiconductor Chip Bonded to a Substrate and Method of Making" teaches injecting encapsulation material into a mold apparatus to encapsulate a semiconductor chip. The semiconductor chip is mounted on a substrate which has a through hole defined therein, such that the injected encapsulation material can flow to the space beneath the chip more easily. However, because the mold apparatus provides a substantially hermetic inner space to hold the chip, the flowing speed of the encapsulation material in such a hermetic space can not be significantly improved. Moreover, undesired air in the mold apparatus is hard to escape during the encapsulation process, and thus voids are generated in the formed encapsulant, which results in a low productivity.

U.S. Pat. No. 5,866,442 granted to Brand for a "Method and Apparatus for Filling a Gap between Spaced Layers of a Semiconductor" discloses using an apparatus having a pressure chamber and a vacuum chamber to carry out the encapsulation process. The semiconductor device to be encapsulated has a plurality of thermal vias defined in the substrate thereof and is positioned between the pressure chamber and vacuum chamber. In the encapsulation process, encapsulation material is injected into the pressure chamber and, at the same time, the pressure of the pressure chamber is increased while the air in the vacuum chamber is evacuated. Therefore, the pressure in the pressure chamber is applied to the vacuum chamber through the thermal vias, and thus the encapsulation material will quickly flow between the chip and substrate of the semiconductor device. However, because the aforementioned apparatus is especially designed for such an encapsulation process, the semiconductor packaging process may be negatively affected by employing such an apparatus. Furthermore, only one semiconductor device can be processed by the apparatus at a time, which severely influences the overall productivity of the semiconductor device. Therefore, there is a continuing need for the aforementioned method and apparatus to be improved.

SUMMARY OF THE INVENTION

One object of the present invention is to provide a method for effectively molding a flip chip semiconductor device without generating a void.

Another object of the present invention is to provide an apparatus for effectively molding a flip chip semiconductor device thereby increasing the productivity of the semiconductor device.

In accordance with one aspect of the present invention, a method for molding a flip chip semiconductor device is present, which includes the following steps: (A) providing a substrate having at least one air hole; (B) mounting a chip on the substrate by multiple solder balls such that the air hole is beneath the chip and surrounded by the multiple solder balls; and (C) placing the substrate mounted with the chip in a mold apparatus which defines at least one air channel aligning with the air hole, such that air can be exhausted via the air hole and the air channel when encapsulation material is entering the mold apparatus.

In accordance with another aspect of the present invention, an apparatus for molding a flip chip semiconductor device is present, which includes: an upper mold body defining a mold gate and an escape hole; and a lower mold body defining a plurality of air channels, each air channel being of a non-straight shape and having an end to face to an air hole defined in a substrate disposed between the upper mold body and the lower mold body.

Other objects, advantages, and novel features of the invention will become more apparent from the following detailed description when taken in conjunction with the accompanying drawings.

DETAILED DESCRIPTION OF THE PREFERRED EMBODIMENT

Figure 1:
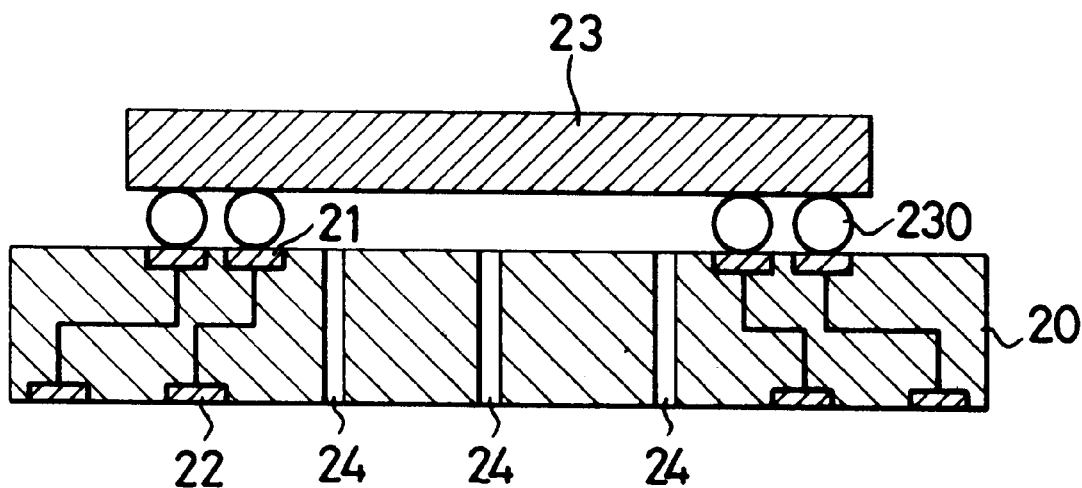
FIG. 1 is a sectional view of a substrate mounted with a chip in accordance with the present invention.

FIG. 1 schematically illustrates a semiconductor device to be processed by a method and apparatus in accordance with the present invention. What is shown is a substrate (20) mounted with a chip (23). Multiple upper and lower connection points (21, 22) are formed respectively on upper and lower surfaces of the substrate (20). The upper connection points (21) are electrically connected with the corresponding lower connection points (22) via conductor lines inside the substrate (20). The chip (23) is mounted on the substrate (20) by multiple solder balls (230) connecting to the upper connection points (22). The lower connection points (22) are provided to connect to other electronic devices.

The substrate (20) defines one or more air holes (24) which are defined in an area beneath the chip (23) and surrounded by the solder balls (230). An encapsulation process thus can be executed to the substrate (20) mounted with the chip (23) by using a mold apparatus, wherein, trapped air in a space between the chip (23) and substrate (20) is exhausted via the air holes (24) such that encapsulation material can flow into the space without generating voids.

Figure 2:
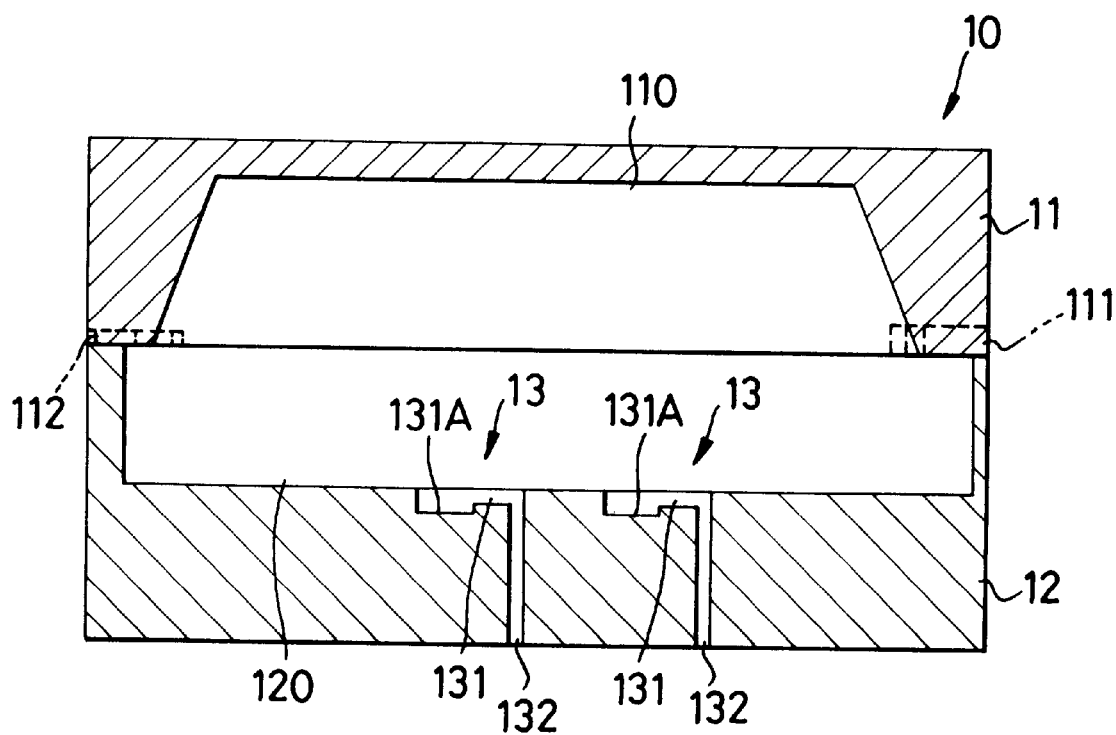
FIG. 2 is a sectional view of a mold apparatus in accordance with the present invention shown in FIG. 4A.
Figure 3:
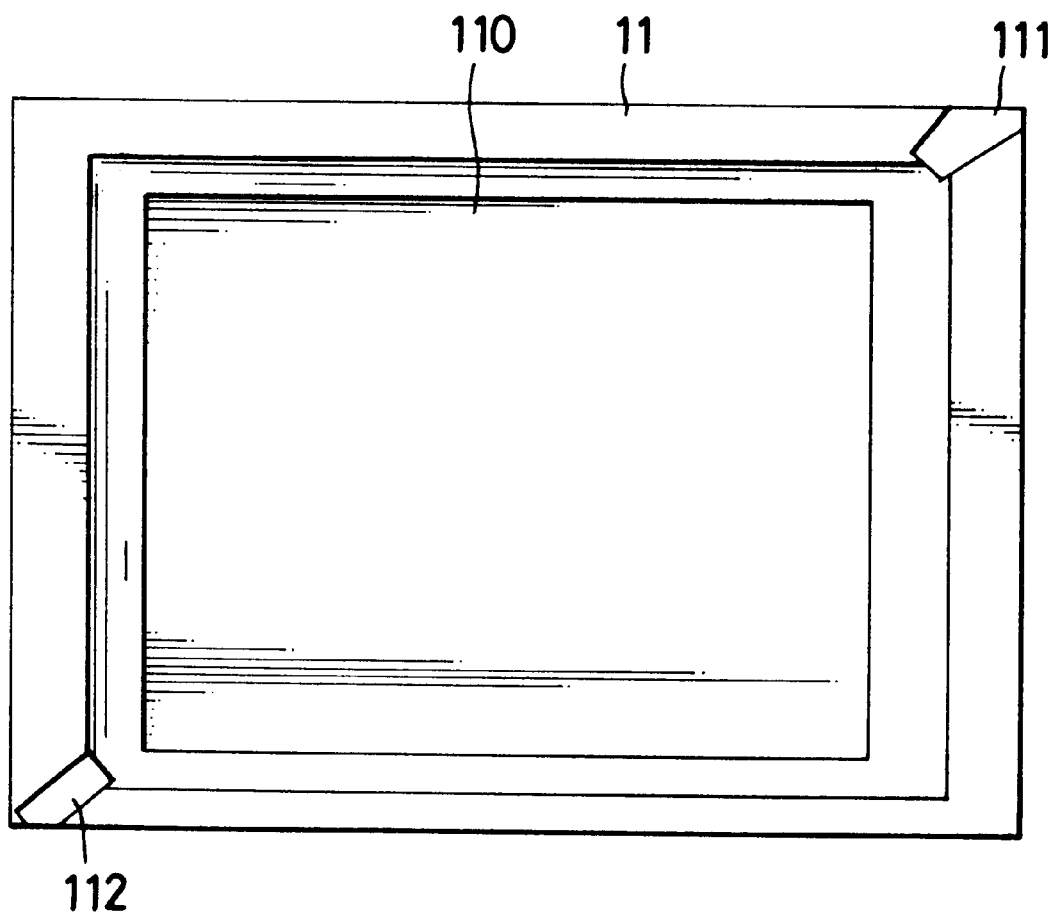
FIG. 3 is a bottom view of an upper mold body of the mold apparatus in accordance with the present invention.

With reference to FIG. 2, a mold apparatus (10) is shown to have an upper mold body (11) and a lower mold body (12). A first cavity (110) is defined in a lower face of the upper mold body (11) to form an encapsulant layer enclosing the chip (23) and the upper face of the substrate (20). In this preferred embodiment, the first cavity (110) is substantially rectangular when viewed from above. Also with reference to FIG. 3, a mold gate (111) is defined around a corner of the first cavity (111) and communicates therewith. An escape hole (112) is defined opposed to the mold gate (111) and also communicates with the first cavity (110). The escape hole (112) can further communicate with a vacuum device to exhaust air in the first cavity (110) thereby improving the encapsulation performance.

Figure 4A:
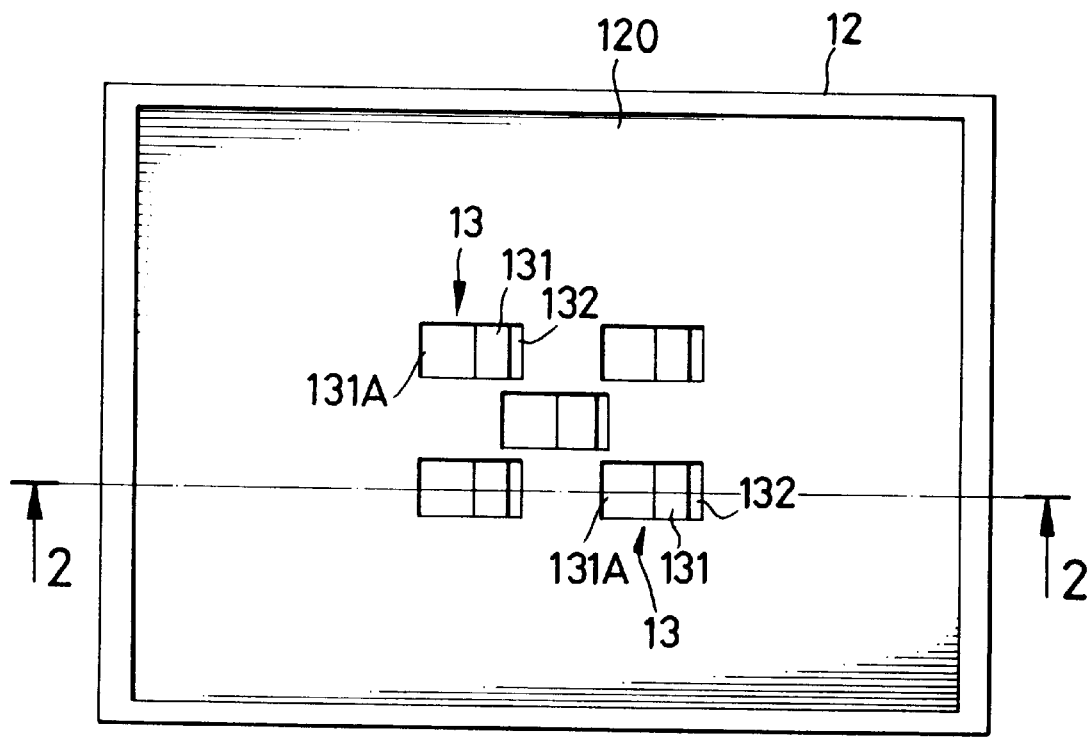
FIGS. 4A–FIG. 4C are top views of various embodiments for a lower mold body of the mold apparatus in accordance with the present invention.

With reference to FIG. 2 and FIG. 4A, a second cavity (120) is defined in an upper face of the lower mold body (12), and receives the substrate (20) therein. A plurality of air channels (13) is defined through the lower mold body (12) to communicate with the second cavity (120). Each air channel (13) is of an irregularly-shaped course, i.e., the inlet and outlet openings of the air channel (13) are not in direct alignment. In this preferred embodiment, each air channel (13) is of a reversed L-shape, as shown in FIG. 2, which has a horizontal channel (131) and a vertical channel (132) communicating with the horizontal channel (131).

As the air channels (13) are identical in shape and function, they are referred to in the singular hereinafter for ease of reference, as are the air holes (24). The horizontal channel (131) is located at a bottom face of the second cavity (120) and is open to the second cavity (120). An open face of the horizontal channel (131) is designed to align with a corresponding one of the air holes (24) of the substrate (20). Furthermore, a free end of the vertical channel (132) is connected to a vacuum device (not shown).

In addition, the open face of the horizontal channel (131) has an area which is always larger than a cross-sectional area of the air hole (24) of the substrate (20). Therefore, even if the open face of the horizontal channel (131) is not exactly aligned with the air hole (24), the horizontal channel (131) still can communicate with the air hole (24).

Furthermore, the horizontal channel (131) of the air channel (13) must have a predetermined depth and length such that the encapsulation material flowing therein will be jelled before dropping to the vertical channel (132), as it is known that the encapsulant material jelled in the vertical channel (132) may result in difficulty while removing the mold apparatus. For example, if the X-43-2646 compound, produced by SHINETSU company, which has particles with averaged diameter of 5 micron-meters is used as the encapsulation material, the horizontal channel (131) must have a depth of at most 15 micron-meters, and preferably of 10 micron-meters.

Figure 5A:
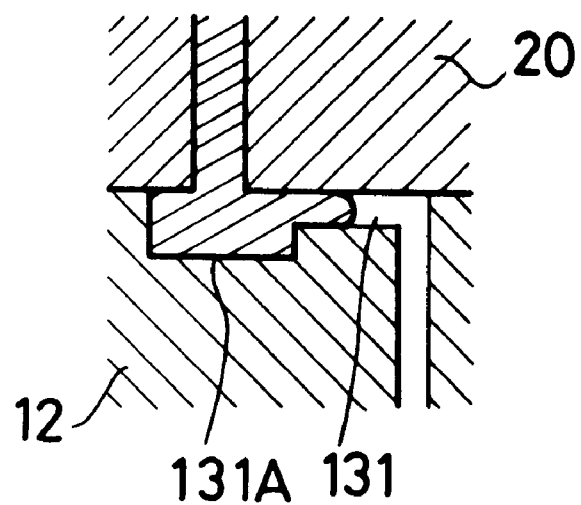
FIGS. 5A and FIG. 5B are sectional views of two different embodiments for the lower mold body in accordance with the present invention.

With reference to FIG. 2 and FIG. 4A, a slot (131A) is defined in the free end portion of the horizontal channel (131). The slot (131A) is deeper than the horizontal channel (131) thereby providing a larger space to hold and buffer the encapsulant material, as shown in FIG. 5A. Furthermore, the horizontal channel (131) is provided to buffer the encapsulant material if it overflows from the slot (131A), and thus preventing the encapsulant material from flowing into the vertical channel (132). Therefore, after the encapsulation process, any of the encapsulant remaining in the slot (131A) and possibly in the horizontal channel (131) can be separated from the lower mold body (12) when the substrate (20) is detached from the lower mold body (12). As a result, there is no residual encapsulant adhered to the lower mold body (12) such that the mold apparatus (10) can be used again without having to be cleaned.

Figure 4B:
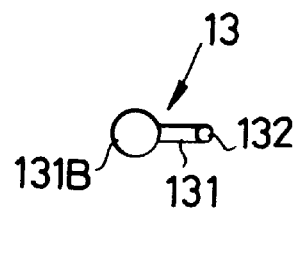

In this preferred embodiment, respective cross sections of the slot (131 A) and the vertical channel are rectangular, however, they can be configured to other shapes. As shown in FIG. 4B, the respective cross sections of the slot (131B) and the vertical channel (132) are both circular.

Figure 4C:
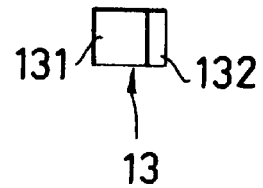
Figure 5B:
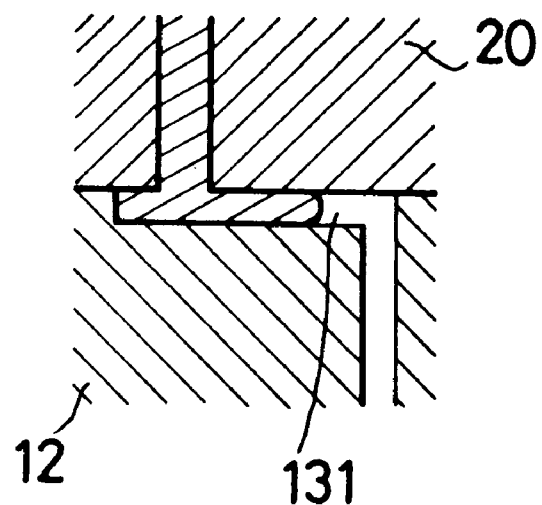

FIG. 4C and FIG. 5B illustrate that the air channel (13) can also be configured to have no slot defined in the free end portion of the horizontal channel (131).

Figure 6:
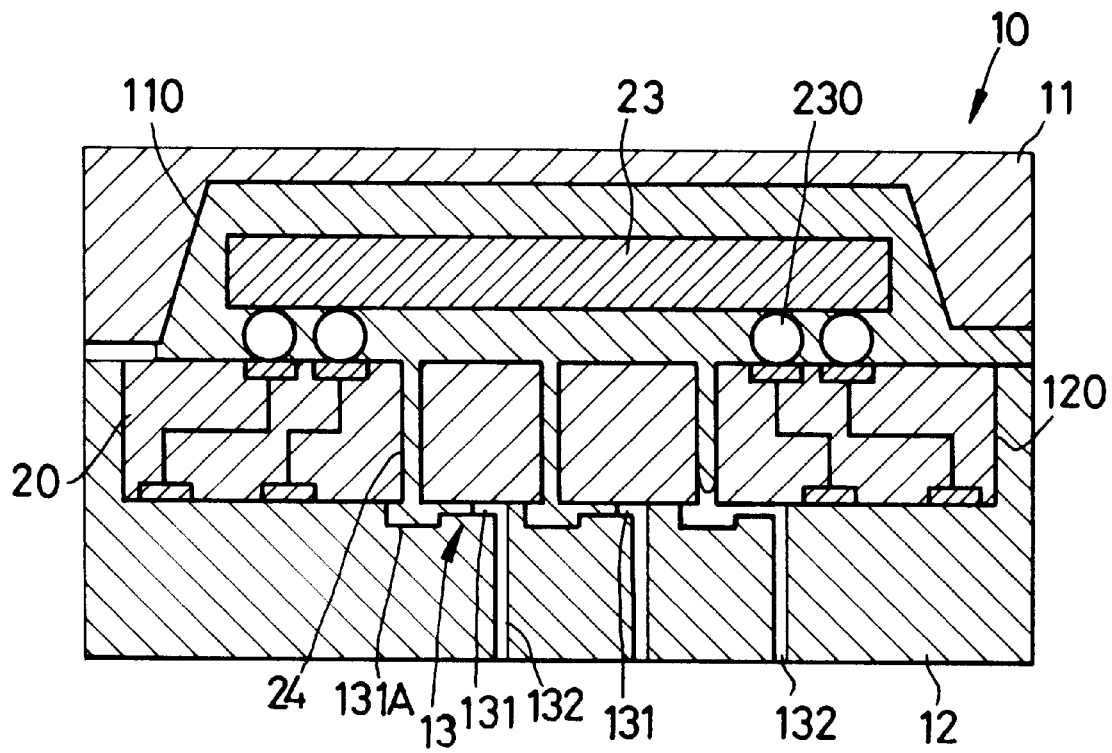
FIG. 6 is a sectional view of the mold apparatus in operating.

In operation, with reference to FIG. 6, the substrate (20) and the chip (23) are placed in the mold apparatus (10). That is, the substrate (20) is held in the second cavity (120) of the lower mold body (12) and the chip mounted on the substrate (20) is in the first cavity (110) of the upper mold body (11). The plurality of the air holes (13) in the substrate (20) is aligned with the air channels (13) in the lower mold body (12), respectively.

The escape channel (112) of the upper mold body (11) and the air holes (13) of the lower mold body (12) are all connected to a vacuum device. When the encapsulation material is being poured into the mold gate (111) of the upper mold body (11), the vacuum device starts to operate. Accordingly, pressure difference between inside and outside the mold apparatus (10) increases thereby exhausting air out of the mold apparatus (10) via the air holes (24) and air channels (13). The pressure difference and the air flow due to the vacuum operation draw the encapsulation material to quickly flow into the space between the substrate (20) and the chip (23). Therefore, the encapsulation process can be effectively accomplished without generating any voids. Moreover, because of the irregular shape design of the air channel (13), there will be no residual encapsulant remaining on the mold apparatus (10) after each encapsulation process, so that the mold apparatus (10) can be used again for the next encapsulation process without having to be cleaned, thereby further enhancing the encapsulating procedure.

Figure 7:
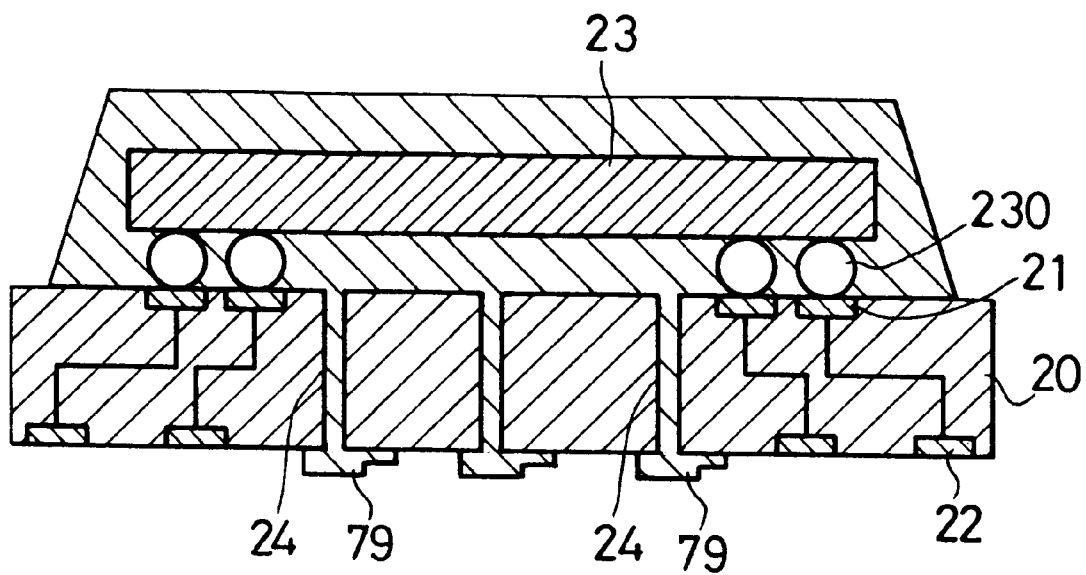
FIG. 7 is a sectional view of a packaged semiconductor device after removing the mold apparatus.
Figure 8:
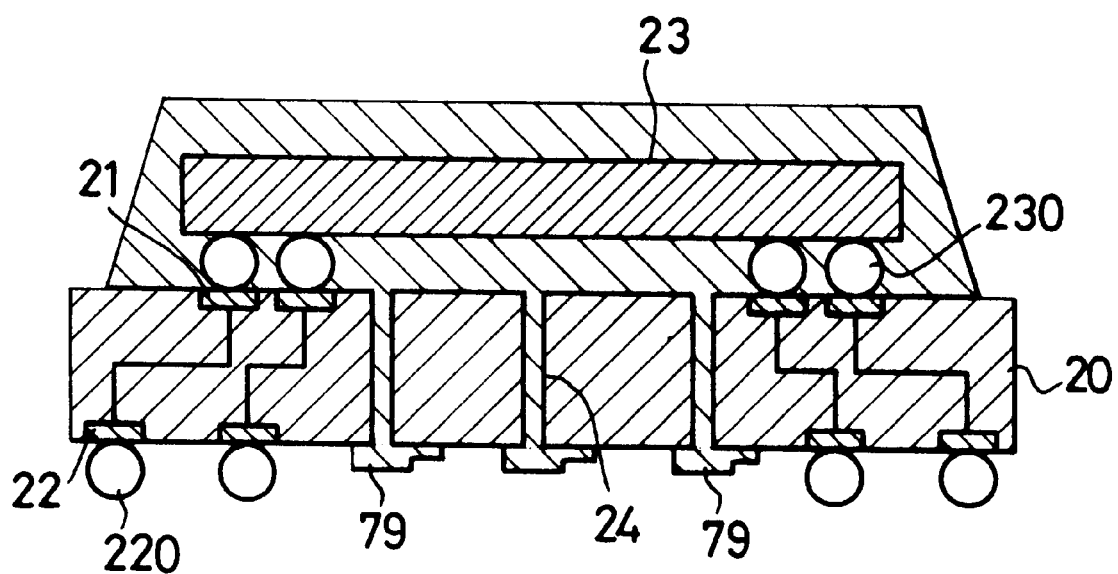
FIG. 8 is a sectional view of the packaged semiconductor device of FIG. 7 mounted with solder balls.
Figure 9:
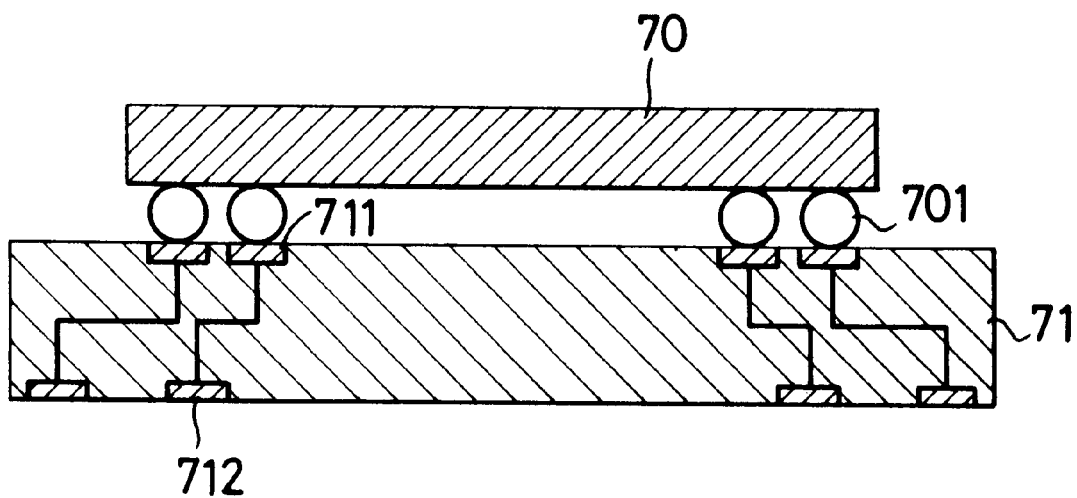
FIG. 9 schematically illustrates the structure of a conventional flip chip semiconductor device.

It is known that, in the encapsulation process, a proper amount of encapsulant poured in the air holes (24) can provide a good encapsulation effect. However, it is difficult to control the encapsulation material to just remain in the air holes (24) without further flowing out of the air holes (24). Therefore, the lower mold body (12) in accordance with the present invention defines the slots (131A) to provide enough space for holding the encapsulating material flowing from the air holes (24), thereby preventing the encapsulation material from flowing into the vertical channel (132). Typically, the encapsulation material will stop flowing in the slots (131A), and thus, after removing the mold apparatus (10), the formed encapsulant will have residual portions (79) protruded from the bottom face of the substrate (20), as shown in FIG. 7. It is not necessary to remove such residual portions (79) of encapsulant because the substrate (20) has to be mounted with solder balls (220), as shown in FIG. 8, and the diameter of each solder ball (220) is generally larger than the thickness of the residual portion (79) of encapsulant. Therefore, there is no additional processing step required to take off the residual portions (79).

In accordance with the above description, it is appreciated that the present invention has the following advantages:

1. The encapsulation process is executed with a high efficiency because the encapsulation material can quickly flow into the space between the chip and the substrate.
2. No additional processing steps and apparatuses are required, as the mold apparatus and vacuum device are generally required in the conventional encapsulation process.
3. The mold apparatus can be re-used without having to be cleaned because there is no residual encapsulant remained on the mold apparatus after the encapsulation process.
4. The encapsulant can fully fillthe space between the chip and the substrate, and multiple semiconductor devices can be simultaneously encapsulated by the molding technique in accordance with the method and apparatus of the present invention, thereby greatly increasing the production of the flip chip semiconductor device.

Although the present invention has been explained in relation to its preferred embodiment, it is to be understood that many other possible modifications and variations can be made without departing from the spirit and scope of the invention as hereinafter claimed.

What is claimed is:

1. A method for molding a flip chip semiconductor device, comprising the steps of:

providing a substrate (20) having at least one air hole (24);

mounting a chip (23) on said substrate (20) by multiple solder balls (220) such that said at least one air hole (24) is beneath said chip (23) and surrounded by said multiple solder balls (230); and placing said substrate (20) mounted with said chip (23) in a mold apparatus (10) that has a lower mold body (12) defined with at least one air channel (13) aligning with said at least one hole (24), such that air can be exhausted via said at least one air hole (24) and said at least one channel (13) when encapsulation material is filling said mold apparatus (10).

2. The method for molding a flip chip semiconductor device as claimed in claim 1, wherein said at least one air channel (13) is of an irregular course.

3. The method for molding a flip chip semiconductor device as claimed in claim 2, wherein said at least one air channel (13) has a horizontal channel (131) communicating with a vertical channel (132).

4. The method for molding a flip chip semiconductor device as claimed in claim 3, wherein said at least one horizontal channel (131) has an open face larger than a cross-sectional area of said air hole (24).

5. The method for molding a flip chip semiconductor device as claimed in claim 3, wherein said at least one horizontal channel (131) has a free end defining therein a slot (131A) which is deeper than said horizontal channel (131).

6. The method for molding a flip chip semiconductor device as claimed in claim 4, wherein said horizontal channel (131) has a free end defined therein a slot (131A) which is deeper than said horizontal channel (131).

* * * * *